(12) United States Patent
Lee (10) Patent No.: US 10,388,391 B2
(45) Date of Patent: Aug. 20, 2019

(54) MEMORY DEVICE AND OPERATING METHOD THEREOF USING CHANNEL BOOSTING BEFORE READ OR VERIFY OPERATION

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/617,043

(22) Filed: Jun. 8, 2017

(65) Prior Publication Data

US 2018/0075916 A1    Mar. 15, 2018

(30) Foreign Application Priority Data

Sep. 12, 2016   (KR) .................. 10-2016-0117335

(51) Int. Cl.
    *G11C 16/34*    (2006.01)
    *G11C 16/30*    (2006.01)
    *G11C 16/26*    (2006.01)
    *G11C 16/24*    (2006.01)
    *G11C 16/12*    (2006.01)
    *G11C 16/04*    (2006.01)

(52) U.S. Cl.
    CPC .......... *G11C 16/3454* (2013.01); *G11C 16/12* (2013.01); *G11C 16/24* (2013.01); *G11C 16/26* (2013.01); *G11C 16/30* (2013.01); *G11C 16/0483* (2013.01)

(58) Field of Classification Search
    CPC ..... G11C 16/3454; G11C 16/12; G11C 16/24; G11C 16/26; G11C 16/30; G11C 16/0483
    See application file for complete search history.

(56) References Cited

U.S. PATENT DOCUMENTS

| 8,023,327 | B2* | 9/2011 | Futatsuyama | G11C 11/5642 |
| | | | | 365/185.17 |
| 9,679,660 | B1* | 6/2017 | Bae | G11C 16/08 |
| 9,799,400 | B2* | 10/2017 | Nam | G11C 16/0483 |
| 2009/0016107 | A1* | 1/2009 | Kim | G11C 16/34 |
| | | | | 365/185.05 |
| 2009/0285026 | A1* | 11/2009 | Kang | G11C 16/08 |
| | | | | 365/185.13 |

(Continued)

FOREIGN PATENT DOCUMENTS

KR   101274205 B1   6/2013

*Primary Examiner* — Mushfique Siddique
(74) *Attorney, Agent, or Firm* — William Park & Associates Ltd.

(57) ABSTRACT

A memory device may include a plurality of memory blocks and one or more peripheral circuits. Each of the plurality of memory blocks may include a plurality of cell strings. The one or more peripheral circuits may perform one or more operations on a selected memory block among the plurality of memory blocks. The operations may include turning off select transistors of the cell strings included in the selected memory block, increasing channel voltages of the cell strings included in the selected memory block by applying a pass voltage to all word lines coupled to the selected memory block, turning on the select transistors included in the selected memory block, and performing a read or a verify operation on the selected memory block.

16 Claims, 9 Drawing Sheets

(56) References Cited

U.S. PATENT DOCUMENTS

| | | | |
|---|---|---|---|
| 2009/0290420 A1* | 11/2009 | Park | G11C 16/3454 365/185.13 |
| 2010/0002515 A1* | 1/2010 | Lutze | G11C 11/5635 365/185.17 |
| 2013/0194870 A1* | 8/2013 | Lee | G11C 16/26 365/185.11 |
| 2013/0250698 A1* | 9/2013 | Kim | G11C 16/24 365/185.25 |
| 2013/0294155 A1* | 11/2013 | Chen | G11C 16/0483 365/185.02 |
| 2013/0336056 A1* | 12/2013 | Maeda | G11C 16/3404 365/185.2 |
| 2014/0169097 A1* | 6/2014 | Shim | G11C 16/24 365/185.17 |
| 2014/0347921 A1* | 11/2014 | Shim | G11C 16/3427 365/185.02 |
| 2016/0372201 A1* | 12/2016 | Moschiano | G11C 16/10 |
| 2016/0372204 A1* | 12/2016 | Lee | G11C 16/16 |
| 2017/0125100 A1* | 5/2017 | Lee | G11C 11/5635 |

* cited by examiner

MEMORY DEVICE AND OPERATING METHOD THEREOF USING CHANNEL BOOSTING BEFORE READ OR VERIFY OPERATION

CROSS-REFERENCE TO RELATED APPLICATION

The present application claims priority under 35 U.S.C. § 119(a) to Korean patent application number 10-2016-0117335 filed on Sep. 12, 2016 in the Korean Intellectual Property Office, the entire disclosure of which is incorporated herein by reference.

BACKGROUND

1. Technical Field

Various embodiments of the present disclosure generally relate to a memory device and an operating method thereof, and more particularly to a read or verify operation of a memory device.

2. Related Art

Memory devices are classified into a volatile memory device and a nonvolatile memory device.

The nonvolatile memory device can retain its contents even when power supply is interrupted. Although read and write speeds thereof are relatively low compared to those of the volatile memory device, the nonvolatile memory device is widely used for portable electronic devices because it retains its contents regardless of whether or not it is connected to a power supply. Examples of the nonvolatile memory device may include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

The flash memory may have a two-dimensional structure in which cell strings are horizontally arranged on a semiconductor substrate. Alternatively, the flash memory may have a three-dimensional structure in which cell strings are vertically arranged on a semiconductor substrate. As the two-dimensional structure is reaching its physical scaling limit, semiconductor manufacturers are producing memory devices that include vertically stacked memory cells.

SUMMARY

In an embodiment of the present disclosure, a memory device may include a plurality of memory blocks and one or more peripheral circuits. Each of the plurality of memory blocks may include a plurality of cell strings. The one or more peripheral circuits may perform one or more operations on the plurality of memory blocks. The operations may include turning off select transistors of the cell strings included in the memory blocks, increasing channel voltages of the cell strings included in the memory blocks, turning on, among select transistors included in the memory blocks, select transistors included in a selected memory block, and performing a read or a verify operation on the selected memory block.

In an embodiment of the present disclosure, a method of operating a memory device may include turning off drain and source select transistors included in cell strings, applying a pass voltage to word lines coupled to memory cells provided between the drain and source select transistors and increasing channel voltages of the cell strings, turning on the drain and select transistors and reducing the channel voltages, and performing a read or a verify operation on the memory cells.

In an embodiment of the present disclosure, a method of operating a memory device may include floating channels of selected cell strings and unselected cell strings, increasing voltages of the channels of the selected cell strings and the unselected cell strings by applying a pass voltage to local word lines coupled to the selected cell strings and unselected cell strings, maintaining voltages of the channels of the unselected cell strings, reducing voltages of the channels of the selected cell strings, and performing a read or a verify operation on memory cells included in the selected cell strings.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Figure 1:
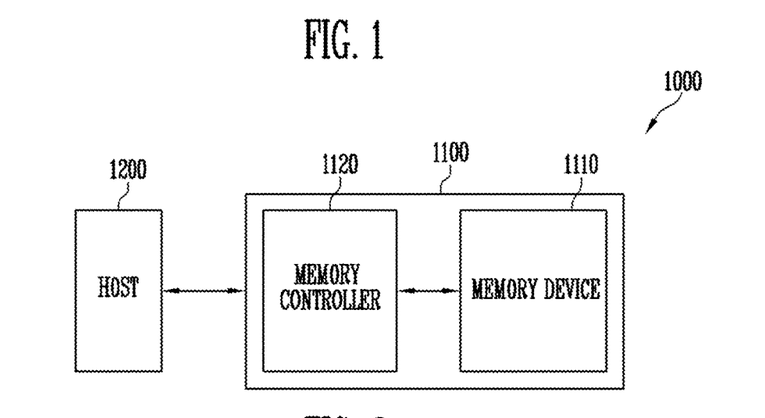
FIG. 1 is a diagram illustrating an example of a memory system in accordance with an embodiment of the present disclosure.

FIG. 1 is a diagram illustrating an example of a memory system in accordance with an embodiment of the present disclosure.

Referring to FIG. 1, a data storage system 1000 may include a memory system 1100 and a host 1200. The memory system 1100 may include a memory device 1110, which stores data, and a memory controller 1120, which controls the memory device 1110.

The host 1200 may communicate with the memory system 1100 using an interface protocol such as a peripheral component interconnect-express (PCI-E), an advanced technology attachment (ATA), a serial ATA (SATA), a parallel ATA (PATA) or a serial attached SCSI (SAS). In addition, the interface protocol provided for the purpose of data communication between the host 1200 and the memory system 1100 may be an interface protocol such as a Universal Serial Bus (USB), a Multi-Media Card (MMC), an Enhanced Small Disk Interface (ESDI), or Integrated Drive Electronics (IDE).

The memory controller 1120 may control overall operation of the memory system 1100 and data exchange between the host 1200 and the memory device 1110. For example, the memory controller 1120 may control the memory device 1110 such that a program, read, or erase operation is performed in response to a request from the host 1200.

The memory device 1110 may include a double data rate synchronous dynamic random access memory (DDR SDRAM), a low power DDR SDRAM fourth generation (LPDDR4 SDRAM), a graphics double data rate SDRAM (GDDR SDRAM), a low power DDR (LPDDR), a Rambus dynamic random access memory (RDRAM) or a flash memory. In an embodiment, the memory device 1110 may be a flash memory.

Figure 2:
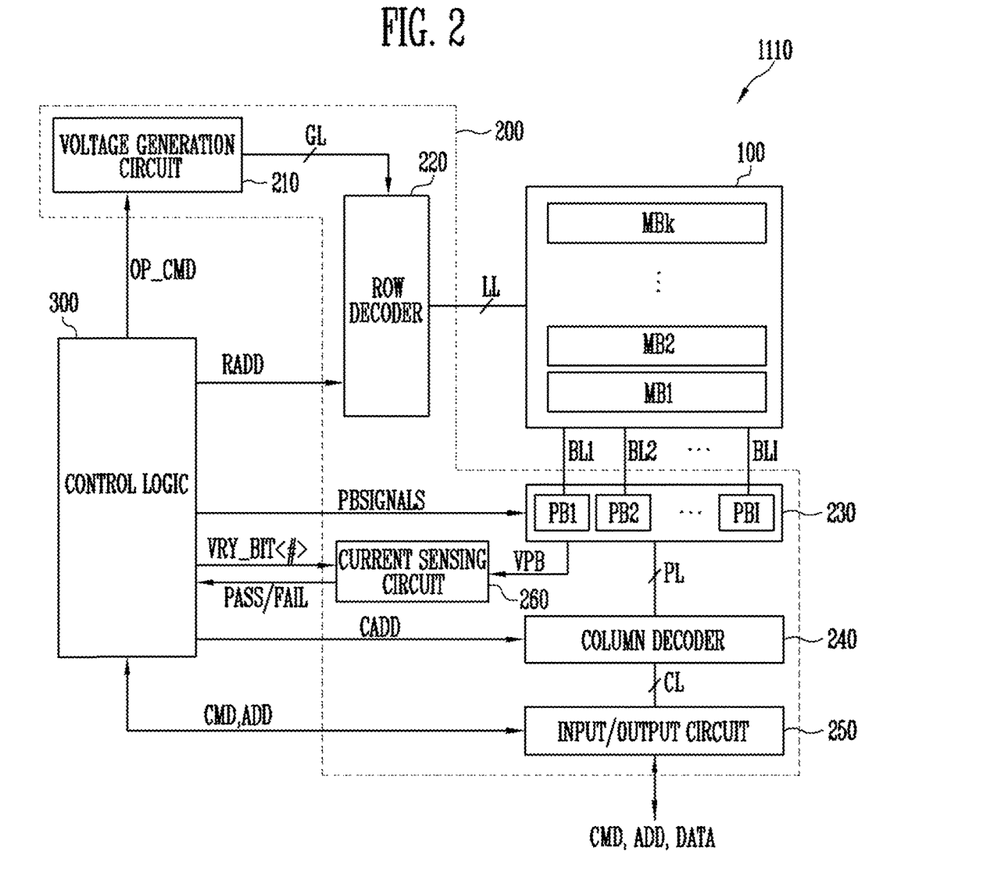
FIG. 2 is a diagram illustrating an example of a memory device of FIG. 1.

FIG. 2 is a diagram illustrating an example of the memory device of FIG. 1.

Referring to FIG. 2, the memory device 1110 may include a memory cell array 100. The memory device 1110 may also include peripheral circuits 200, which perform a program operation for storing data in the memory cell array 100, a read operation for outputting the stored data, and an erase operation for erasing the stored data. The memory device 1110 may include a control logic 300, which controls the peripheral circuits 200 in response to control signals provided by the memory controller (e.g., 1120 of FIG. 1).

Memory cells of the semiconductor memory device 1110 may be arranged in the memory cell array 100. The memory cells of the memory cell array 100 may be grouped into a plurality of memory blocks MB1 to MBk (k is a positive integer). Local lines LL and bit lines BL1 to BLl (l is a positive integer) may be coupled to each of the memory blocks MB1 to MBk. The local lines LL may include a source line, source select lines, word lines, and drain select lines. Depending on the structure of each memory block, the local lines LL may include pipelines. The bit lines BL1 to BLl may be coupled in common to the memory blocks MB1 to MBk.

Each of the memory blocks MB1 to MBk may include a normal memory cell block and a flag cell block. The normal memory cell block may include normal memory cells in which user data may be stored. The flag cell block may include flag cells in which information related to the memory device may be stored. For instance, information about whether a certain logical page has been programmed may be stored in the flag cells.

The peripheral circuits 200 may perform program, read and erase operations on a selected memory block in response to control signals provided by the control logic 300.

Each operation will be described in brief below.

The program operation may be performed on a page basis. A multi-level cell flash memory may store two or more bits per memory cell. Storing two or more bits in a single memory cell may include mapping of data bits to threshold voltage states of the memory cell. For example, in a multi-level cell flash memory that can store three bits per cell, each bit of the three bits may be stored in a different logical page associated with a physical page. In a multi-level cell flash memory, two or more logical pages may be associated with a single physical page. The program operation may be performed through an incremental step pulse program (ISPP) method increasing the program voltage by a step voltage. For example, the program operation may include applying a program voltage to a word line coupled to a target memory cell (hereinafter referred to as "program voltage application operation") and verifying whether the program operation of the target memory cell has been completed by reading data of the target memory cell (hereinafter referred to as "program verify operation"). The program voltage application operation and the program verify operation may be performed repeatedly until the target cell has passed the verify operation. In the program voltage application operation, a program voltage applied to a selected word line coupled to the target memory cell may increase the threshold voltage of the target memory cell. In the program verify operation, a verify voltage is applied to the selected word line, and a pass voltage is applied to unselected word lines to determine whether the target memory cell has been programmed to an intended voltage level.

The erase operation may be performed on a memory block basis, and thus all of the memory cells included in a selected memory block may be erased at the same time. The erase operation may be performed through an incremental step pulse erase (ISPE) method in which the erase voltage is increased by a step voltage. For example, the erase operation may include applying an erase voltage (hereinafter referred to as "erase voltage application operation") and verifying whether the erase operation of the selected memory block has been completed (hereinafter referred to as "erase verify operation"). The erase voltage application operation and the erase verify operation may be performed repeatedly until the selected memory block has passed the erase verify operation. In the erase voltage application operation, an erase voltage may be applied to a source line or bit line of a selected memory block, and an erase enable voltage (e.g., 0V) may be applied to corresponding word lines to decrease the threshold voltages of the memory cells. The erase verify operation may be performed by applying a verify voltage to all of the word lines or by applying a verify voltage to a selected word line and applying a pass voltage to the other unselected word lines.

The read operation may be performed in a manner similar to the verify operation. For example, the read operation may be performed in such a way that a read voltage is applied to a selected word line while a pass voltage is applied to the other unselected word lines.

During the verify operation or the read operation, in order to remove capacitance between word lines and the channel, a channel boosting operation increasing a potential of a channel may be preceded before a verify voltage or a read voltage is applied to a selected word line. In an embodiment, a voltage to be applied to select lines may be adjusted to speed up the channel boosting operation.

The peripheral circuits 200 may generate operating voltages that are used during the program, erase and read operations, and may apply the operating voltages to selected memory blocks. In an embodiment, the peripheral circuits 200 may include a voltage generation circuit 210, a row decoder 220, a page buffer unit 230, a column decoder 240, an input/output circuit 250, and a current sensing circuit 260.

Detailed descriptions of the respective circuits are as follows.

In response to an operation signal OP_CMD, the voltage generation circuit 210 may generate various operating voltages that may be used during program, read and erase operations. For example, the voltage generation circuit 210 may generate operating voltages such as a program voltage, an erase voltage, a read voltage, a verify voltage, and a pass voltage, and may also generate select voltages to be applied to the drain and source select lines. The voltage generation circuit 210 transmits operating voltages to global lines GL.

The row decoder 220 may transmit, in response to a row address RADD, the operating voltages applied to the global lines GL to local lines LL coupled to a selected memory block.

The page buffer unit 230 may include a plurality of page buffers PB1 to PBI coupled to the bit lines BL1 to BLI. The page buffers PB1 to PBI may operate in response to page buffer control signals PBSIGNALS. For example, the page buffers PB1 to PBI may temporally store data input from an external device during a program operation. Furthermore, the page buffers PB1 to PBI may sense the voltages or currents of the bit lines BL1 to BLI during a read or a verify operation. The page buffer unit 230 may apply a precharge voltage to the bit lines BL1 to BLI coupled in common to the memory blocks MB1 to MBk, according to data received from the column decoder 240.

The column decoder 240 may transmit data between the input/output circuit 250 and the page buffer unit 230 in response to a column address CADD. For example, the column decoder 240 may exchange data with the page buffers PB through data lines DL or exchange data with the input/output circuit 250 through column lines CL.

The input/output circuit 250 may transmit a command CMD or an address ADD received from the memory controller (e.g., 1120 of FIG. 1) to the control logic 300, or may exchange data DATA with the column decoder 240.

During the read or the verify operation, the current sensing circuit 260 may generate a reference current in response to an enable bit VRY_BIT<#>, and may compare a sensing voltage VPB received from the page buffer unit 230 with a reference voltage generated by the reference current and output a pass signal PASS or a fail signal FAIL.

The control logic 300 may control the peripheral circuits 200 by outputting an operation signal OP_CMD, a row address RADD, the page buffer control signals PBSIGNALS, and the enable bit VRY_BIT<#> in response to the command CMD and the address ADD. The control logic 300 may determine whether a target memory cells has passed a verification during the verify operation in response to the pass or fail signal PASS or FAIL. Particularly, during the read or the verify operation, the control logic 300 may control the peripheral circuits 200 such that voltages applied to the global lines GL can be rapidly transmitted to the local lines LL.

Figure 3:
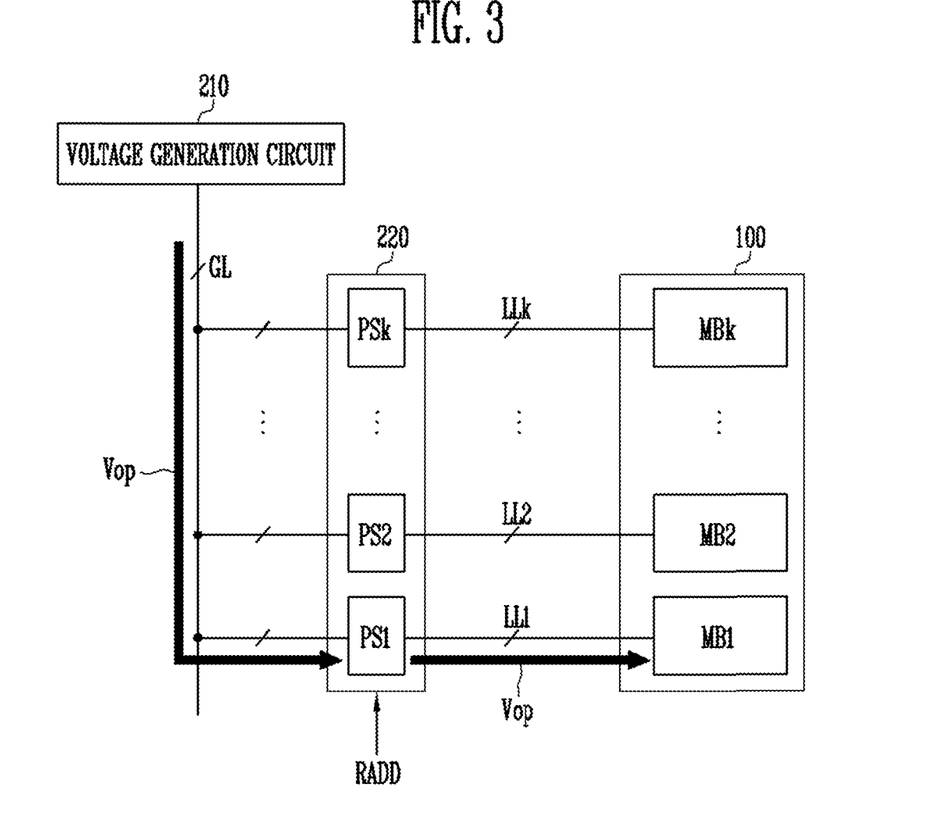
FIG. 3 is a diagram illustrating an example of a process of transmitting an operating voltage to a selected memory block.

FIG. 3 is a diagram illustrating an example of a process of transmitting an operating voltage to a selected memory block.

Referring to FIG. 3, in a case where a first to k-th (k is a positive integer) memory blocks MB1 to MBk are included in the memory cell array 100, the row decoder 220 may include first to k-th pass switch circuits PS1 to PSk. The first to k-th pass switch circuits PS1 to PSk may be coupled between the global lines GL and the local lines LL1 to LLk. In more detail, the first to k-th pass switch circuits PS1 to PSk may be coupled in common to the global lines GL and respectively coupled to the local lines LL1 to LLk. The local lines LL described with reference to FIG. 2 are the same as the local lines LL1 to LLk of FIG. 3. That is, when the first pass switch circuit PS1 is enabled, operating voltages Vop applied to the global lines GL may be transmitted to the first local lines LL1.

In response to a row address RADD, only one pass switch circuit, among the first to k-th pass switch circuits PS1 to PSk, may be selected and enabled, and the other pass switch circuits may be disabled. For example, if the first pass switch circuit PS1 is selected, the first pass switch circuit PS1 transmits operating voltages Vop, which have been applied to the global lines GL, to the first local lines LL1, and the second to k-th pass switch circuits PS2 to PSk are disabled, so that the second to k-th local lines LL2 to LLk may float.

Figure 4:
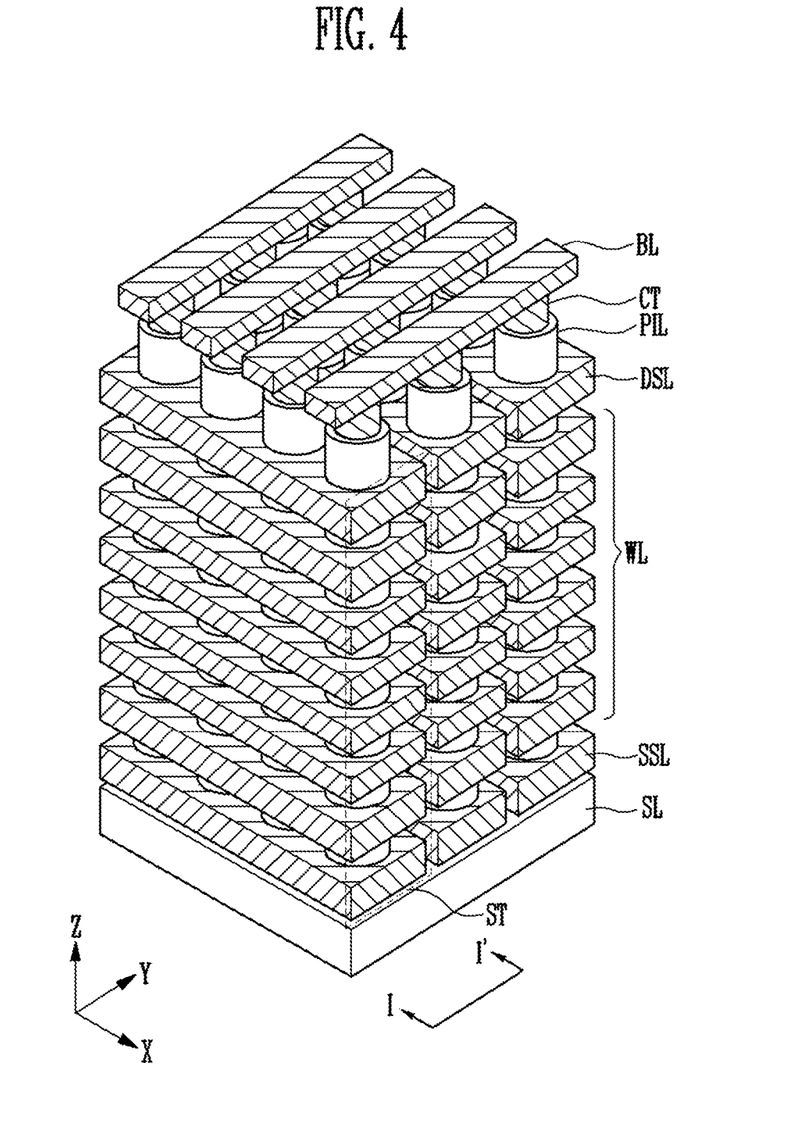
FIG. 4 is a perspective view illustrating an example of a memory block having a three-dimensional structure.

FIG. 4 is a perspective view illustrating an example of a memory block having a three-dimensional structure.

Referring to FIG. 4, the memory block having a three-dimensional structure may include cell strings ST formed in a vertical direction (e.g., Z-direction) on a substrate and arranged between the bit lines BL and the source line SL. For example, the cell strings ST may be formed in an I-shape. This structure may be called "Bit Cost Scalable" (BiCS). For example, in the case where the source line SL is horizontally formed on the substrate, the strings ST having a BiCS structure may be formed vertically on the source line SL. In more detail, the strings ST may include source select lines SSL, word lines WL, and drain select lines DSL, which are arranged in a first direction (e.g., Y direction) and spaced apart from each other. The number of source select lines SSL, the number of word lines WL and the number of drain select lines DSL are not limited to those shown in FIG. 4. Vertical channel layers CH may be formed to vertically pass through the source select lines SSL, the word lines WL, and the drain select lines DSL. Memory cells may be formed on portions of the vertical channel layers CH, which are in contact with the word lines WL. Source select transistors may be formed on portions of the vertical channel layers CH, which are in contact with the source select lines SSL. Drain select transistors may be formed on portions of the vertical channel layers CH, which are in contact with the drain select lines DSL. The bit lines BL may be coupled to upper ends of contact plugs CT protruding upwardly from the vertical channel layers CH.

Figure 5:
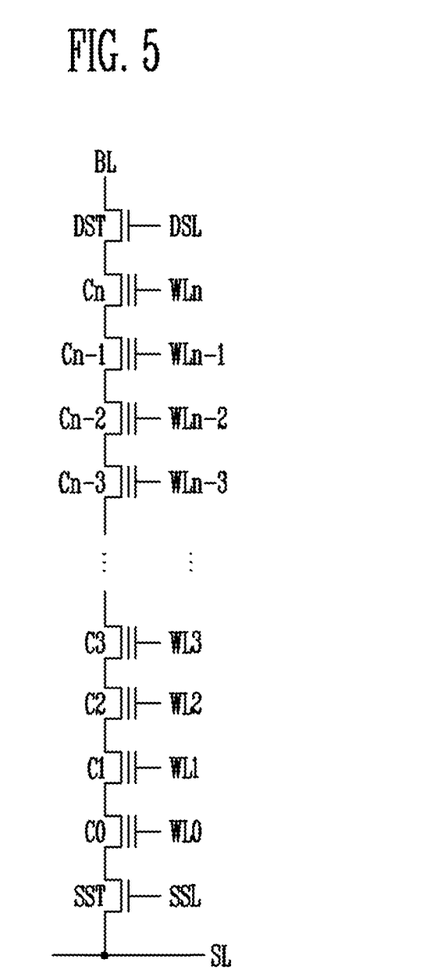
FIG. 5 is a diagram illustrating an example of a cell string shown in FIG. 4.

FIG. 5 is a diagram illustrating an example of a cell string shown in FIG. 4.

Referring to FIG. 5, the cell string may include a source select transistor SST, memory cells C0 to Cn, and a drain select transistor DST, which are coupled in series to each other between the source line SL and the bit line BL. A gate of the source select transistor SST may be coupled to the source select line SSL. Gates of the memory cells C0 to Cn may be coupled to the word lines WL0 to WLn, respectively. A gate of the drain select transistor DST may be coupled to the drain select line DSL. The source select line SSL, the word lines WL0 to WLn, and the drain select line DSL may be included in the local lines (e.g., LL of FIG. 2).

Figure 6:
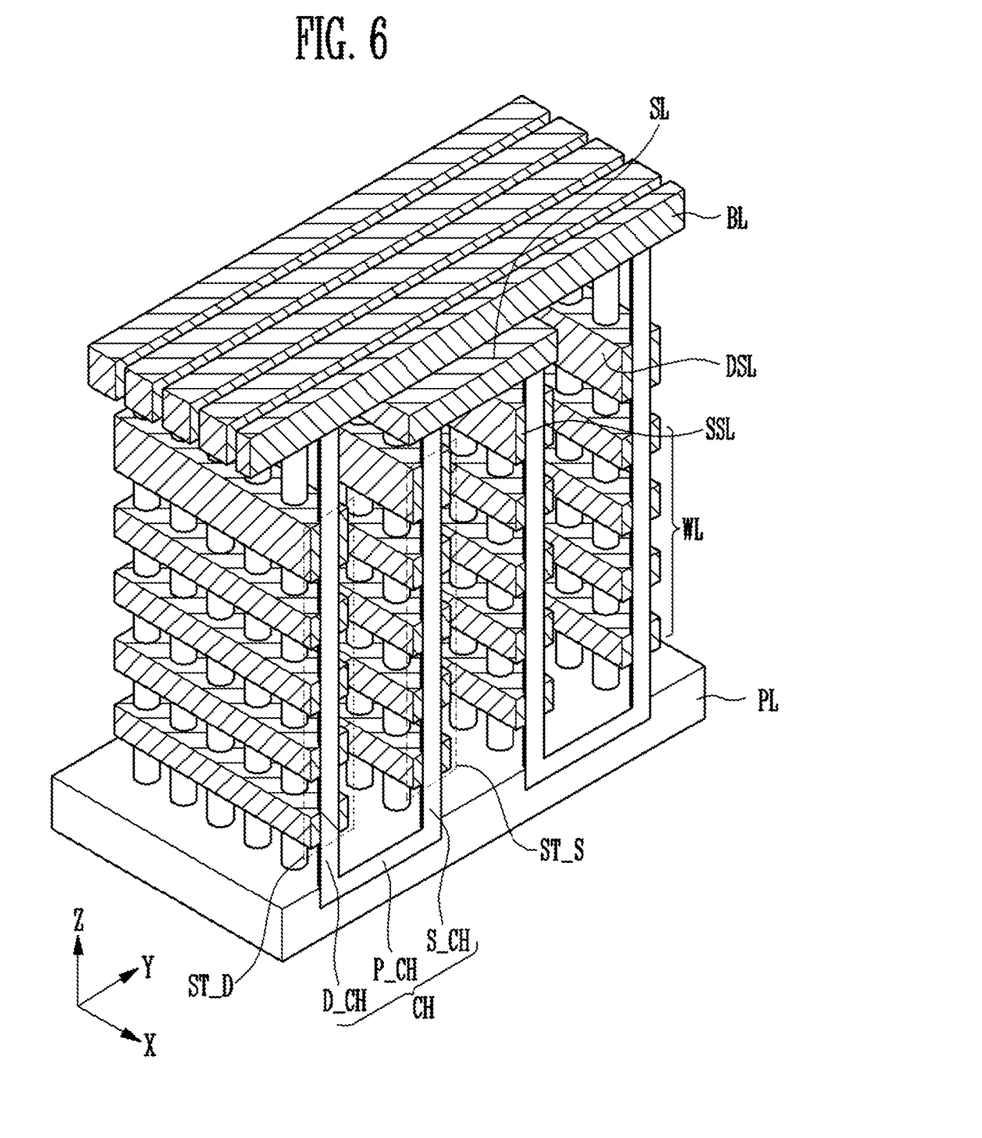
FIG. 6 is a perspective view illustrating an example of the memory block having a three-dimensional structure.

FIG. 6 is a perspective view illustrating an example of the memory block having a three-dimensional structure.

Referring to FIG. 6, the memory block having a three-dimensional structure may include source strings ST_S and drain strings ST_D each formed in a vertical (e.g., Z-direction) on a substrate and connected to each other through pipe channels formed in the substrate. In an embodiment, the source and drain strings ST_S and ST_D and the pipe channel may form a U-shape. Here, one end of the drain string ST_D may be coupled to the bit lines BL, and one end of the source string ST_S may be coupled to the source lines SL. Each source string ST_S and the corresponding drain string ST_D may be coupled to each other through a pipe channel P_CH to form the U shape. The pipe channel P_CH may be coupled to a pipe line PL. In detail, the source strings ST_S may be vertically arranged between the source lines SL and the pipe line PL. The drain strings ST_D may be vertically arranged between the bit lines BL and the pipe line PL. This structure may be called "Pipe-shaped Bit Cost Scalable" (P—BiCS).

In more detail, the drain strings ST_D may include word lines WL and drain select lines DSL, which are arranged in the first direction (e.g., Y direction) and spaced apart from each other. The drain strings ST_D may also include drain vertical channel layers D_CH, which vertically pass through the word lines WL and the drain select lines DSL. The source strings ST_S may include word lines WL and source select lines SSL, which are arranged in the first direction (e.g., Y direction) and spaced apart from each other. The source strings ST_S may also include source vertical channel layers S_CH, which vertically pass through the word lines WL and the source select lines SSL. The drain vertical channels D_CH and the source vertical channels S_CH may be coupled to each other by pipe channel layers P_CH in the pipe line PL. The bit lines BL may come into contact with upper ends of the drain vertical channel layers D_CH protruding upwardly from the drain select lines DSL. The bit lines BL may be arranged in a second direction (e.g., X direction) perpendicular to the first direction (e.g., Y direction).

Figure 7:
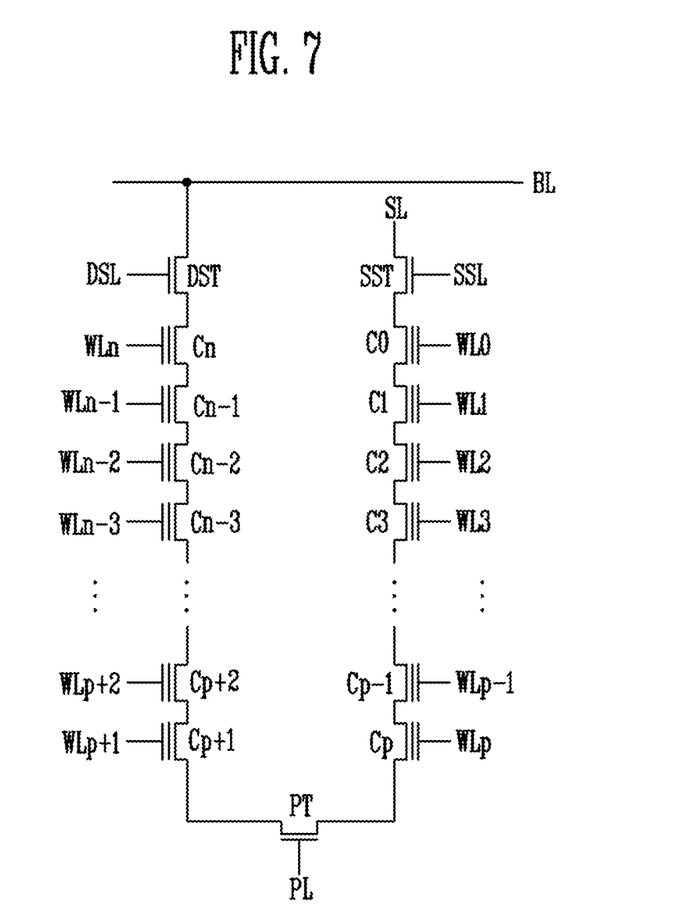
FIG. 7 is a diagram illustrating an example of a cell string shown in FIG. 6.

FIG. 7 is a diagram illustrating an example of a cell string shown in FIG. 6.

Referring to FIG. 7, the cell string may include a source select transistor SST, memory cells C0 to Cp (p is a positive integer), a pipe transistor PT, memory cells Cp+1 to Cn (n is a positive integer), and a drain select transistor DST, which are coupled in series to each other between the source line SL and the bit line BL. A gate of the source select transistor SST may be coupled to the source select line SSL. Gates of the memory cells C0 to Cp may be coupled to the word lines WL0 to WLp. A gate of the pipe transistor PT may be coupled to the pipe line PL. Gates of the memory cells Cp+1 to Cn may be coupled to the word lines WLp+1 to WLn, respectively. A gate of the drain select transistor DST may be coupled to a drain select line DSL. The source select line SSL, the word lines WL0 to WLn, the pipe line PL, and the drain select line DSL may be included in the local lines (e.g., LL of FIG. 2).

Figure 8:
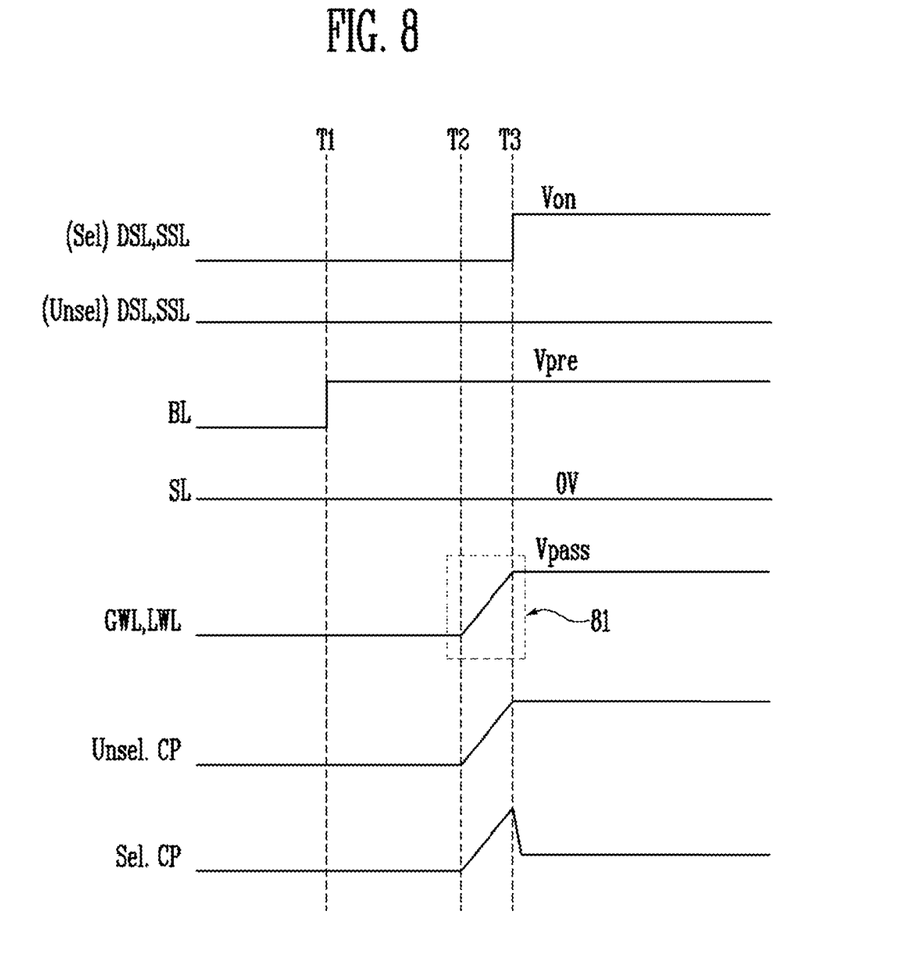
FIG. 8 is a timing diagram illustrating an example of an operating method in accordance with an embodiment of the disclosure.

FIG. 8 is a timing diagram illustrating an example of an operating method in accordance with an embodiment of the disclosure.

Referring to FIG. 8, during a read or a verify operation, in order to remove capacitance between the word lines LWL and the channel, a channel boosting operation for increasing the potential of the channels may be preceded before a verify voltage or a read voltage is applied to a selected word line. A method of applying voltages to the respective lines during the channel boosting operation will be described below.

All of the pass switch circuits are enabled so that all of the memory blocks are selectable. For example, all switches included in the pass switch circuits are turned on, whereby the global lines and the local lines of the memory blocks are coupled to each other. Here, the source line SL may be coupled to a ground terminal to have a potential of zero volts.

At a first point in time T1, a positive precharge voltage Vpre is applied to the bit lines BL. As a result, all of the drain and select lines DSL and SSL coupled to the memory blocks float, and thus all of the drain and source select transistors included in the memory blocks are turned off. Therefore, all of the channels of the cell strings float. Consequently, the precharge voltage Vpre applied to the bit lines BL is not transmitted to the channels of the cell strings.

At a second point in time T2, a pass voltage Vpass of a positive voltage is applied to the global word lines GWL. Here, the global word lines GWL are signal lines that are included in the global lines (e.g., GL of FIG. 3) and coupled to the local word lines LWL through the pass switch circuits. Because all of the pass switch circuits are left enabled, when the pass voltage Vpass is applied to the global word lines GWL, the pass voltage Vpass is transmitted to all of the local word lines LWL. Here, the local word lines LWL are signal lines that are coupled to gates of transistors constituting memory cells included in the memory blocks. Because all of the channels of the cell strings are left floating, the pass voltage Vpass applied to the global word lines GWL may be immediately transmitted to the local word lines LWL, as shown by reference numeral 81. Therefore, the time it takes to apply the pass voltage Vpass to the local word lines LWL may be reduced.

When the pass voltage Vpass of a positive voltage is applied to the local word lines LWL coupled to the memory blocks, as shown by reference numeral 81, channel boosting increasing the potentials of the floating channels of the cell strings may occur. As a result of the channel boosting, channel voltages CP of all of the cell strings may be simultaneously increased. Because the pass voltage Vpass is applied to the local word lines LWL while the channels of the cell strings are left floating, the time it takes to apply the pass voltage Vpass may be reduced. Hence, the time T2 to T3 it takes to increase the channel voltages CP may be reduced.

At a third point in time T3, a target memory block of a read or a verify operation is selected. In order for the target memory block to remain selected, the selected pass switch circuit is left enabled, and the other unselected pass switch circuits are left disabled. For example, all of the switches included in the selected pass switch circuit are turned on, and all of the switches included in the unselected pass switch circuits are turned off. Therefore, the global lines are coupled to the local lines of only the selected memory block, while the local lines coupled to the unselected memory blocks are floating. Therefore, channel voltage of selected cell strings of the selected memory block may decrease, and channel voltage of unselected cell strings of the unselected memory blocks may be maintained.

Thereafter, a turn-on voltage Von is applied to the drain and source select lines (Sel) DSL and SSL coupled to the selected memory block. The turn-on voltage Von may be generated from the voltage generation circuit (e.g., 210 of FIG. 3).

When the turn-on voltage Von is applied to the drain and source select lines (Sel) DSL and SSL coupled to the selected memory block, the drain and source select transistors included in the selected memory block are turned on. Here, the drain and source select lines (Unsel) DSL and SSL included in the unselected memory blocks are left floating, so that the drain and source select transistors included in the unselected memory blocks remain turned off. Thus, the channel voltage Sel. CP of the selected memory block decreases, and the channel voltage Unsel. Cp of the unselected memory blocks are maintained at the voltage increased during the channel boosting. In detail, in the selected memory block, because all of the drain and source select transistors are turned on, the bit lines BL and the source line SL are coupled to the channel. Although the precharge voltage Vpre is applied through the bit lines BL, because a voltage of zero volts is applied to the source line SL, the channel voltage Sel. CP of the selected memory block decreases. As such, in the state in which the channel voltage Sel. CP of the selected memory block is low and the channel voltage Unsel. CP of the unselected memory blocks is high, the read or the verify operation may be performed.

Figure 9:
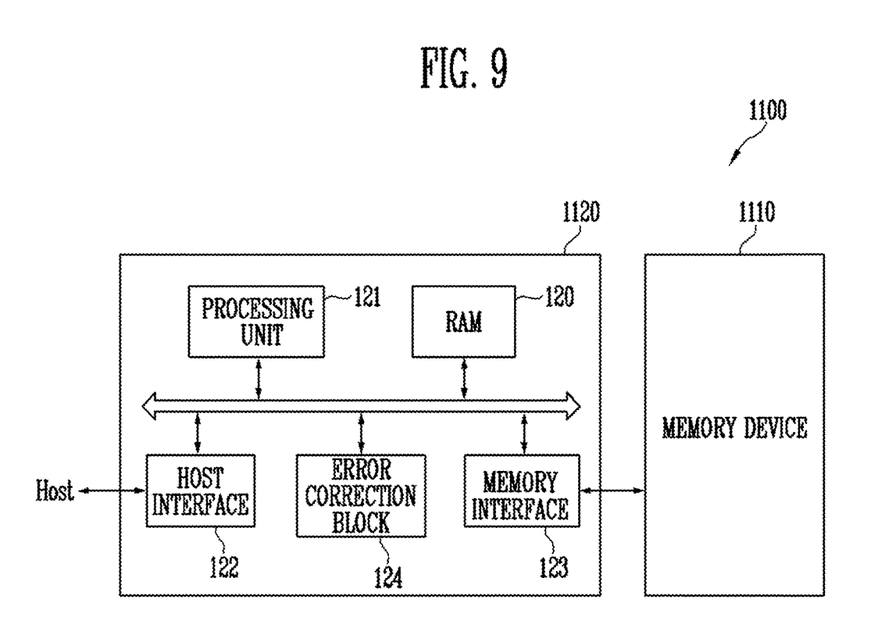
FIG. 9 is a diagram illustrating an example of a memory system including the memory device of FIG. 2.

FIG. 9 is a diagram illustrating an example of a memory system including the memory device of FIG. 2.

Referring to FIG. 9, the memory system 1100 may include a memory device 1110 and a memory controller 1120. The memory device 1110 here may be the same as that described above, and thus any repetitive detailed description will be omitted.

The memory controller 1120 may be coupled to a host HOST and the memory device 1110. The memory controller 1120 may access the memory device 100 in response to a request from the host Host. For example, the controller 1120 may control read, write, erase, and background operations of the memory device 1110. The controller 1120 may provide an interface between the memory device 100 and the host Host. The controller 1120 may drive firmware for controlling the memory device 1110.

The memory controller 1120 may include a random access memory (RAM) 121, a processing unit 122, a host interface 123, a memory interface 124, and an error correction block 125. The RAM 121 may be used as at least one of an operation memory of the processing unit 122, a cache memory between the memory device 1110 and the host Host, and a buffer memory between the memory device 1110 and the host Host. The processing unit 122 may control the overall operation of the memory controller 1120. In addition, the memory controller 1120 may temporarily store program data provided from the host Host during a write operation.

The host interface 123 may include a protocol for performing data exchange between the host Host and the memory controller 1120. In an embodiment, the memory controller 1120 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 124 may interface with the memory device 1110. For example, the memory interface may include a NAND interface or a NOR interface.

The error correction block 125 may use an error correcting code (ECC) to detect and correct an error in data received from the memory device 1110. The processing unit 122 may adjust the read voltage according to an error detection result from the error correction block 125, and control the memory device 1110 to perform re-reading. In an exemplary embodiment, the error correction block 125 may be provided as an element of the memory controller 1120.

In an embodiment, the memory system 1100 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the memory device 1110 or the memory system 1100 may be embedded in various types of packages. For example, the memory device 1110 or the memory system 1100 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 10:
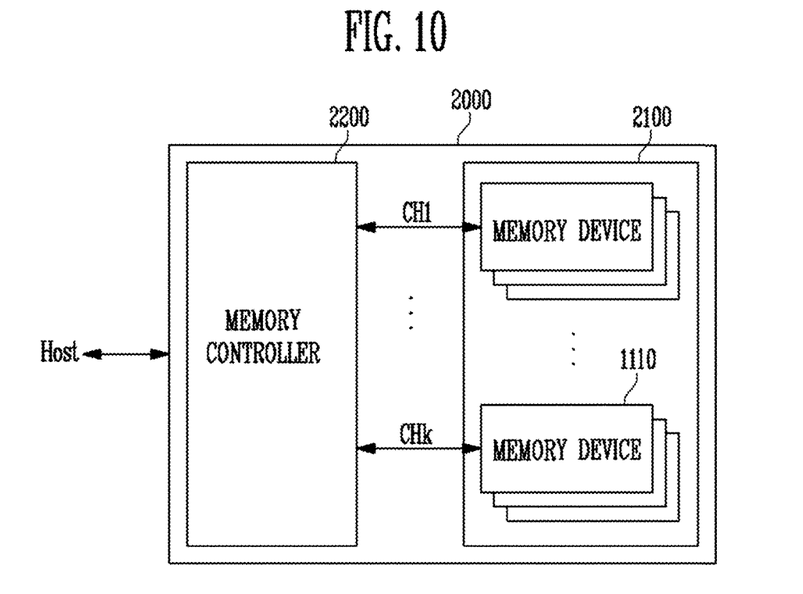
FIG. 10 is a diagram illustrating an example of a memory system including the memory device of FIG. 2.

FIG. 10 is a diagram illustrating an example of a memory system including the memory device of FIG. 2.

Referring to FIG. 10, the memory system 2000 may include a storage device 2100 and a memory device 2100. The storage device 2100 may include a plurality of memory devices. The memory devices may be divided into a plurality of groups. Each of the plurality of groups communicates with the memory controller 2200 through first to k-th channels CH1 to CHk. Each memory device may have the same configuration as those of the memory device 1110 described with reference to FIG. 2.

Each group may communicate with the memory controller 2200 through one common channel. The memory controller 2200 may have the same configuration as that of the memory controller 1120 described with reference to FIG. 9, and may control the plurality of memory devices 1110 included in the storage device 2100 through the plurality of channels CH1 to CHk.

Figure 11:
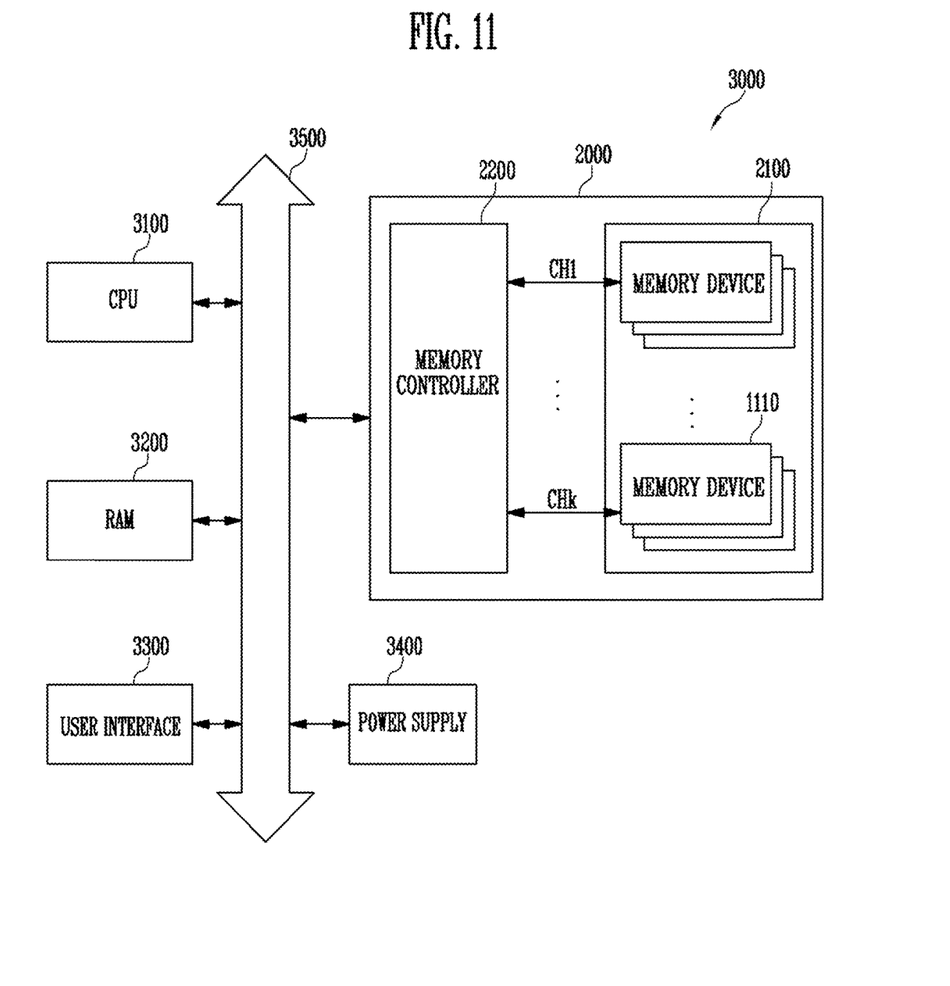
FIG. 11 is a diagram illustrating an example of a computing system including the memory system of FIG. 10.

FIG. 11 is a diagram illustrating an example of a computing system including the memory system of FIG. 10.

Referring to FIG. 11, the computing system 3000 may include a central processing unit (CPU) 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 11, the storage device 2100 is illustrated as being coupled to the system bus 3500 through the memory controller 2200. Furthermore, the storage device 2100 may be directly coupled to the system bus 3500. Here, the memory controller 2200 may be operated by the CPU 3100 and the RAM 3200.

In FIG. 11, the memory system 2000 described with reference to FIG. 10 may be provided. Furthermore, the memory system 2000 may be replaced with the memory system 1100 described with reference to FIG. 9. In an embodiment, the computing system 3000 may be formed of the memory system 1100 or 2000 described with reference to FIG. 9 or 10.

The present disclosure provides a technology that may improve an operating speed of a memory device and, particularly, reduce the time it takes to perform a read or a verify operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
   a plurality of memory blocks each of which includes a plurality of cell strings; and
   one or more peripheral circuits configured to perform one or more operations on a selected memory block among the plurality of memory blocks, the operations comprising:
   turning off select transistors of the cell strings included in the selected memory block;
   applying a precharge voltage to one or more bit lines and applying a ground voltage to one or more source lines;
   increasing channel voltages of the cell strings included in the selected memory block by applying a pass voltage to all word lines coupled to the selected memory block after applying the precharge voltage to the bit lines and the ground voltage to the source lines;
   turning on the select transistors of the cell strings included in the selected memory block; and
   performing a read or a verify operation on the selected memory block.

2. The memory device according to claim 1, wherein each of the cell strings comprises:
   a plurality of select transistors; and
   a plurality of memory cells coupled in series to each other between the plurality of select transistors.

3. The memory device according to claim 2, wherein a portion of the select transistors is coupled to the bit lines, and remaining select transistors are coupled to the source lines.

4. The memory device according to claim 1, wherein the one or more peripheral circuits comprise:
   a voltage generation circuit configured to generate operating voltages having various levels;
   a plurality of switch circuits configured to transmit the operating voltages to signal lines coupled to the selected memory block, in response to a row address; and
   a page buffer unit configured to apply a precharge voltage to bit lines coupled in common to the memory blocks, according to received data.

5. The memory device according to claim 1, wherein the operations of the one or more peripheral circuits include, when increasing the channel voltages of the cell strings, increasing the channel voltages by the same level regardless of selected cell strings or unselected cell strings.

6. The memory device according to claim 1, further comprising:
   a control logic configured to control the one or more peripheral circuits in response to a command and an address received from an external device.

7. A method of operating a memory device comprising:
   turning off drain and source select transistors included in each of a plurality of cell strings;
   applying a precharge voltage to bit lines coupled to the drain select transistors, and applying a ground voltage to a source line coupled to the source select transistors;
   applying a pass voltage to all word lines coupled to memory cells included between the drain select transistors and the source select transistors to increase channel voltages of the cell strings after applying the precharge voltage to the bit lines and the ground voltage to the source line;
   turning on the drain and select transistors to reduce channel voltages of selected cell strings; and
   performing a read or a verify operation on the memory cells.

8. The method according to claim 7, wherein turning off the drain and source select transistors is performed on both selected cell strings and unselected cell strings.

9. The method according to claim 7, wherein increasing the channel voltages of the cell strings is performed on both selected cell strings and unselected cell strings.

10. The method according to claim 7, wherein reducing the channel voltages is performed only on the selected cell strings among the cell strings.

11. The method according to claim 10, wherein when the channel voltages of the selected cell strings decrease, the channel voltages of unselected cell strings among the cell strings are maintained at a previous level.

12. The method according to claim 7, wherein performing the read or the verify operation on the memory cells is performed on the selected cell strings among the cell strings.

13. A method of operating a memory device comprising:
floating channels of selected cell strings and unselected cell strings included in a selected memory block;
applying a precharge voltage to bit lines coupled to the drain select transistors;
applying a ground voltage to a source line coupled to the source select transistors;
applying a pass voltage to all local word lines coupled to the selected cell strings and the unselected cell strings to increase voltages of the channels of the selected cell strings and the unselected cell strings;
maintaining voltages of the channels of the unselected cell strings, and reducing voltages of the channels of the selected cell strings; and
performing a read or a verify operation on memory cells included in the selected memory block.

14. The method according to claim 13, further comprising, before reducing the voltages of the channels of the selected cell strings, coupling the source line coupled to the cell strings to a ground terminal.

15. The method according to claim 13, further comprising, before applying the pass voltage to the local word lines, applying the precharge voltage to the bit lines coupled to the cell strings.

16. A method of operating a memory device comprising:
floating channels of selected cell strings and unselected cell strings included in a selected memory block, wherein the selected and unselected cell strings are coupled between bit lines and a source line;
applying a precharge voltage to bit lines, and applying a ground voltage to the source line;
applying a pass voltage to local word lines coupled to the selected cell strings and the unselected cell strings to increase voltages of the channels of the selected cell strings and the unselected cell strings after applying the precharge voltage and the ground voltage to the bit lines and the source line;
maintaining voltages of the channels of the unselected cell strings, and reducing voltages of the channels of the selected cell strings; and
performing a read or a verify operation on memory cells included in the selected memory block.

* * * * *